United States Patent
Na et al.

(10) Patent No.: US 9,224,882 B2
(45) Date of Patent: Dec. 29, 2015

(54) LOW VOLTAGE PHOTODETECTORS

(71) Applicant: Intel Corporation, Santa Clara, CA (US)

(72) Inventors: Yun-Chung Na, Hsinchu (TW); Han-Din Liu, Santa Clara, CA (US); Yimin Kang, San Jose, CA (US); Shu-Lu Chen, Foster City, CA (US)

(73) Assignee: Intel Corporation, Santa Clara, CA (US)

( * ) Notice: Subject to any disclaimer, the term of this patent is extended or adjusted under 35 U.S.C. 154(b) by 132 days.

(21) Appl. No.: 14/129,181

(22) PCT Filed: Aug. 2, 2013

(86) PCT No.: PCT/US2013/053443
§ 371 (c)(1),
(2) Date: Dec. 24, 2013

(87) PCT Pub. No.: WO2015/016942
PCT Pub. Date: Feb. 5, 2015

(65) Prior Publication Data
US 2015/0037048 A1  Feb. 5, 2015

(51) Int. Cl.
*H04B 10/06* (2006.01)
*H01L 31/0216* (2014.01)
(Continued)

(52) U.S. Cl.
CPC ........ *H01L 31/02161* (2013.01); *H01L 31/028* (2013.01); *H01L 31/02327* (2013.01);
(Continued)

(58) Field of Classification Search
CPC ...... H04B 10/60; H04B 10/616; H04B 10/69; H04B 10/691
See application file for complete search history.

(56) References Cited

U.S. PATENT DOCUMENTS 7,902,620 B2 *  3/2011  Assefa et al. ................. 257/432
8,232,516 B2 *  7/2012  Assefa et al. ............. 250/214.1
(Continued)

FOREIGN PATENT DOCUMENTS

JP  2007504659 A  3/2007
WO  2005024897 A2  3/2005

OTHER PUBLICATIONS

Solomon Assefa et al.; Waveguide-Integrated Germanium Avalanche Photodetector for Low-Noise and High-Speed Operation; 978-1-4244-6346-6/10/$26.00 © 2010 IEEE; One page.
(Continued)

*Primary Examiner* — Dzung Tran
(74) *Attorney, Agent, or Firm* — Green, Howard & Mughal LLP

(57) ABSTRACT

A low voltage photodetector structure including a semiconductor device layer, which may be Ge, is disposed over a substrate semiconductor, which may be Si, for example within a portion of a waveguide extending laterally within a photonic integrated circuit (PIC) chip. In exemplary embodiments where the device layer is formed over an insulator layer, the insulator layer is removed to expose a surface of the semiconductor device layer and a passivation material formed as a replacement for the insulator layer within high field regions. In further embodiments, controlled avalanche gain is achieved by spacing electrodes in a metal-semiconductor-metal (MSM) architecture, or complementary doped regions in a p-i-n architecture, to provide a field strength sufficient for impact ionization over a distance not significantly more than an order of magnitude greater than the distance that a carrier must travel so as to acquire sufficient energy for impact ionization.

22 Claims, 8 Drawing Sheets

(51) Int. Cl.
*H01L 31/107* (2006.01)
*H01L 31/0224* (2006.01)
*H01L 31/028* (2006.01)
*H01L 31/0232* (2014.01)
*H01L 31/108* (2006.01)
*H01L 31/18* (2006.01)
*H04B 10/60* (2013.01)

(52) U.S. Cl.
CPC ...... *H01L31/022408* (2013.01); *H01L 31/107* (2013.01); *H01L 31/1085* (2013.01); *H01L 31/1868* (2013.01); *H01L 31/1872* (2013.01); *H04B 10/60* (2013.01)

(56) References Cited

U.S. PATENT DOCUMENTS

| | | |
|---|---|---|
| 2005/0116311 A1 | 6/2005 | Kim et al. |
| 2007/0170476 A1* | 7/2007 | Giziewicz et al. ............ 257/292 |
| 2008/0085120 A1 | 4/2008 | Xie et al. |
| 2008/0203447 A1* | 8/2008 | Arnold et al. ................ 257/288 |
| 2009/0134486 A1* | 5/2009 | Fujikata ........................ 257/449 |
| 2009/0242932 A1 | 10/2009 | Luryi |
| 2010/0176420 A1* | 7/2010 | Yao .............................. 257/187 |
| 2012/0126286 A1 | 5/2012 | Na |
| 2014/0197509 A1* | 7/2014 | Haddad et al. ................ 257/432 |

OTHER PUBLICATIONS

Solomon Assefa et al.; Reinventing Germanium Avalanche Photodetector for Nanophotonic On-Chip Optical Interconnects; Nature/vol. 464/Mar. 4, 2010; pp. 80-85.

Yimin Kang et al.; Monolithic Germanium/Silicon Avalanche Photodiodes With 340 CHz Gain-Bandwidth Product; Nature Photonics | Advance Online Publication | www.nature.com/naturephotonics; pp. 1-5.

Solomon Assefa et al.; CMOS-Integrated High-Speed MSM Germanium Waveguide Photodetector; Mar. 1, 2010 / vol. 18, No. 5 / Optics Express 4986; 14 Pages.

International Search Report and Written Opinion received for PCT Patent Application No. PCT/US2013/053443, mailed on Apr. 29, 2014, 11 pages.

* cited by examiner

LOW VOLTAGE PHOTODETECTORS

This invention was made with Government support under contract number H98230-10-9-0021 awarded by the Department of Defense. The Government has certain rights in this invention.

TECHNICAL FIELD

Embodiments of the invention are generally related to monolithic photodetectors, and more particularly pertain to avalanche photodiodes (APD).

BACKGROUND

A photonic integrated circuit (PIC) is useful as an optical data link in applications such as optical communications, high performance computing, and data centers. For mobile computing platforms too, a PIC is a promising I/O for rapidly updating or syncing a mobile device with a host device and/or cloud service where a wireless link has insufficient bandwidth. Such optical links utilize an optical I/O interface that includes an optical transmitter and/or an optical receiver, at least one of which utilizes a photodetector, typically a photodiode.

An Avalanche Photodiode (APD) is one type of photodiode that is particularly useful in applications where high sensitivity is desired because they can offer signal gain through carrier multiplication mechanisms within the photoelectric semiconductor material. Such applications include fiber-optic telecommunication, laser rangefinders, and single photon level detection and imaging, among other applications. The gain-bandwidth product is a key metric in photodetectors and some of the most promising APD designs have employed silicon because one important property limiting the gain-bandwidth product is the effective k ratio ($k_{eff}$) of the photoelectric material. The $k_{eff}$ is a ratio between hole and electron impact ionization coefficients, and a low $k_{eff}$ is desirable for an APD. Silicon has an excellent $k_{eff}$ of <0.1, however it suffers low absorbance in the near infrared band utilized by many photonic applications (e.g., fiber-optic telecom). Germanium and many III-V material systems do have good responsivity at such wavelengths, however $k_{eff}$ in these materials is so high that they have thus far proven unsuitable for APD applications. For example, $k_{eff}$ of InP is 0.4-0.5 and $k_{eff}$ of Ge is 0.8-0.9. Furthermore, it is costly and technically difficult to monolithically integrate Ge or III-V materials on a silicon substrate. For example, epitaxial processing is often needed, which is expensive.

Another issue limiting the performance of photodetectors, and an APD in particular, is high dark current. High dark current, like excess noise, can limit sensitivity of a detector. While dark currents in the nanoamp range are often achieved in a silicon-based APD, dark currents in Ge-based APDs, for example, can be in the tens or hundreds of microamps. Dark current can have a number of sources, including thermionic emission and trap-assisted tunneling resulting from Fermi-level pinned surface states and crystal defects, for example stemming from lattice mismatch (e.g., 4% mismatch between Ge and Si).

High operating biases also remain an obstacle to a PIC integrating silicon CMOS circuitry and photonics onto a single chip. Silicon-based electrical circuitry, such as analog circuitry for sensing photodiode output, is typically designed for a 3.3V supply. APDs described in the art however often require a significantly higher bias voltage and are therefore generally beyond the operating space of even system-on-chip (SoC) technologies.

A practical photodetector design and a fabrication process permitting low voltage operation with sufficient gain-bandwidth product in the near infrared wavelength would therefore be advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
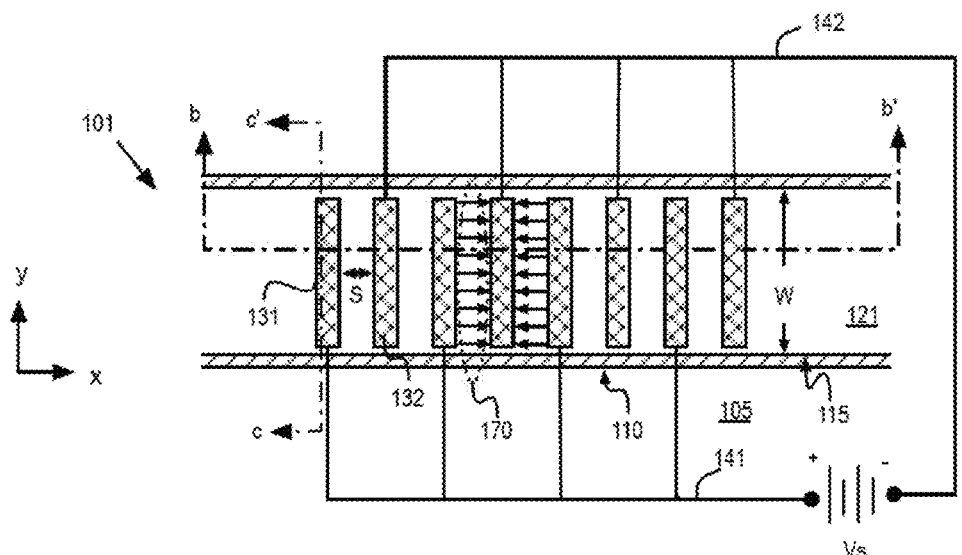
FIG. 1A is a plan view of a waveguide-coupled metal-semiconductor-metal (MSM) photodetector structure, in accordance with an embodiment.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings and are not intended to restrict the application of claimed subject matter. Therefore, the following detailed description is not to be taken in a limiting sense and the scope of claimed subject matter is defined solely by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

As described in greater detail below, low voltage photodiode structures may be disposed within a waveguide extending laterally over a region of a PIC chip. The low voltage photodiode structure including a semiconductor device layer suitable for near infrared applications, such as Ge, is disposed over a substrate semiconductor suitable for integrated circuitry, such as Si. In exemplary embodiments where the device layer is formed over a dielectric layer, the dielectric layer is removed to expose a surface of the semiconductor device layer and a passivation layer is formed as a replacement for the dielectric layer within high field regions. Replacement of the dielectric layer may offer the advantage of reduced dark current for improve photodiode sensitivity (i.e., gain-bandwidth product). In further embodiments, sensitivity is improved through controlled avalanche gain by spacing electrodes in a metal-semiconductor-metal (MSM) architecture, or by spacing complementary doped regions in a p-i-n architecture, to provide a field strength sufficient for impact ionization over a distance that is not significantly greater than an order of magnitude more than the distance that a carrier must travel to acquire sufficient energy for impact ionization.

Referring to FIG. 1A as an example of one embodiment, low voltage photodiode structure 101 includes a patterned semiconductor device layer 115 disposed over a substrate 105. Generally, photodiode structure 101 is a metal-semiconductor-metal (MSM) structure in which pairs of metal electrodes 131, 132 form a series of Schottky diodes with device layer 115. Metal electrode 131 is one of a plurality of first electrodes electrically coupled to device layer 115 within an area of substrate 105. All of these first electrodes are coupled together, for example by routing metal 141, to sustain a first electrical potential (e.g., $V_s$). Likewise, electrode 132 is one of a plurality of second electrodes electrically coupled to device layer 115 and interdigitated with the first electrodes to have an electrode spacing S between adjacent electrode pairs. The second electrodes are similarly coupled together, for example by routing metal 142, to sustain a second electrical potential (e.g., ground). In embodiments where only one level of metallization is employed, electrode pairs 131, 132 form finger structures extending across opposite longitudinal edges of device layer 115 to implement the routing metal 141, 142.

Device layer 115 is a photoelectric semiconductor material such that when exposed to electromagnetic radiation of an energy greater than the band gap of the semiconductor, charge carriers (electron-hole pairs) are generated and collected as a photocurrent driven by the operating bias $V_s$. In embodiments, the device layer is of a semiconductor other than silicon and in one advantageous embodiment, the device layer 115 is Ge, although it may also be any group IV alloy (e.g., SiGe, SiGeC, etc.), or group III-V alloy system (e.g., GaAs, InP, InAs, etc.) having absorbance at a desired wavelength of light. In another exemplary embodiment for example, device layer 115 is InGaAs, which like Ge, also adsorbs in the near infrared. In advantageous MSM embodiments, the device layer 115 is substantially pure (non-alloyed) with homogenous doping at intrinsic levels. For example, in the exemplary Ge embodiments, impurity levels are below $10^{17}/cm^3$. In further embodiments, the device layer 115 is at least polycrystalline, advantageously substantially monocrystalline. In general, higher quantum efficiency and lower dark currents can be expected with longer range crystallinity. In further embodiments, the device layer 115 has a lattice orientation epitaxial to that of the crystal structure in substrate layer 110 (i.e., crystal planes of device layer 115 are aligned with those of substrate layer 110).

Figure 1B:
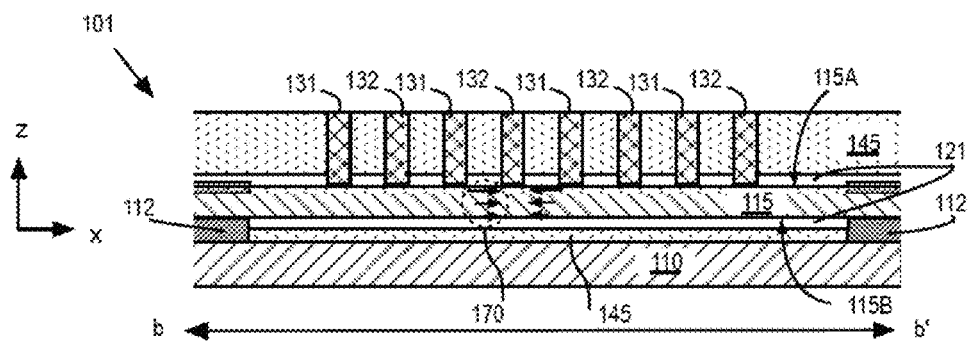
FIG. 1B is a cross-sectional view of the MSM photodetector along the b-b' line shown in FIG. 1A depicted in FIG. 1A, in accordance with an embodiment.

Substrate 105 may be any substrate known in the art to be suitable for forming an IC, such as, but not limited to, a semiconductor substrate, semiconductor-on-insulator (SOI) substrate, an insulator substrate (e.g., sapphire), or the like, and/or combinations thereof. In one exemplary embodiment, substrate 105 comprises a substantially monocrystalline semiconductor, such as, but not limited to, silicon. Substrate layer 110 may be either a top portion of a bulk substrate, or a top layer of an SOI substrate. As further shown in FIGS. 1A and 1C, both substrate layer 110 and device layer 115 are patterned into an elongated optical waveguide having a substantially constant nominal transverse width W (e.g., y-dimension) over a longitudinal length (e.g., x-dimension). In the exemplary embodiments, device layer 115 is optically coupled to substrate layer 110, for example by evanescent coupling whereby portions of a mode of an electromagnetic radiation propagating along the longitudinal length of the waveguide extend in the z-dimension beyond substrate layer 110 to enter device layer 115. With proper dimensioning of the width and z-thickness of device layer 115 and substrate layer 110, optical mode intensity may be made highest within device layer 115 as illustrated by dashed rings 177 in FIG. 1C. Generally, the width W is a couple of micrometers, but may be sub-micrometer as well. For one exemplary embodiment having a Ge device layer 115 and silicon substrate layer 110, width W is advantageously between 0.2 and 0.75 μm for both layers 110, 115. A similar range is also applicable to the z-height of layer 110 or layer 115, with advantageous Ge embodiments having a z-thickness of less than 400 nm to improve field uniformity across the thickness of device layer 115. As illustrated in FIG. 1B by decreasing arrow length with increasing distance from electrode pair 131, 132, the shallow nature of a Schottky junction can result in a decreasing field toward device layer 110. Advantageously, the field strength at the surface of device layer 115 most proximate to device layer 110 is at least sufficient to saturate carrier drift velocities.

Referring still to FIG. 1A, during device operation the operating bias $V_S$ applied across metal electrode pairs 131, 132 generates an electric field in spacing S between adjacent electrodes. In the depicted embodiment, all electrode pairs have substantially the same dimensions and electrode pairs 131, 132 are dimensioned to extend across the majority of the transverse width W of the patterned device layer 115. In specific embodiments, electrode pairs 131, 132 extend across at least 50% of width W, advantageously at least 75% of width W, and more advantageously at least 90% of width W. As so dimensioned, an electric field within the space S may be substantially uniform across the width W (i.e., field lines 170 are substantially orthogonal to width W, or substantially parallel to a longitudinal length of the patterned device layer 115 over a greater percentage of the width W). In an alternative embodiment, electrode pairs 131, 132 approximate point contacts, having diameters not more than 25% of the width W. Such point electrode contacts may, for example, be arrayed down the longitudinal length of device layer 115. For such point contact embodiments, the operating bias applied across nearest neighbors results in a non-uniform electric field over both the width W and across the space S, which may result in a lower responsivity and/or a slower response time limiting the gain-bandwidth product relative to the exemplary embodiment depicted in FIG. 1A.

In embodiments, adjacent electrode pairs are spaced apart by a sufficiently small spacing S that a multiplication region within device layer 115 provides an avalanche gain, M, such that photodiode structure 101 functions as an APD. As used herein, avalanche gain refers to amplification through multiplication of charge carriers in the device layer 115 through impact ionization motivated by a sufficiently strong electric field. A multiplication region 170 has a field strength at or above a critical field strength that triggers impact ionization and amplification of charge carriers in semiconductor device layer 115. The field strength needed is a function of the semiconductor material and is readily determinable from literature. Operating bias $V_s$ needed to achieve a sufficiently high field is a function of the dimension of spacing S such that a lower bias is needed from a smaller spacing S. Where an electric field is too strong, band-to-band tunneling will disadvantageously dominate impact ionization. In embodiments, therefore, operating bias $V_s$ is to be such that a multiplication region is present within the spacing S. For the exemplary embodiment depicted in FIG. 1A, because of the uniform field, the multiplication region 170 within spacing S extends across at least a majority of the width W. In specific embodiments, where electrode pairs 131, 132 extend across at least 50% of width W, advantageously at least 75% of width W, and more advantageously at least 90% of width W, a multiplication region advantageously extends across at least 50% of width W, advantageously at least 75% of width W, and more advantageously at least 90% of width W.

In further embodiments, the electric field at a desired operating bias $V_s$ is above the critical field strength for impact ionization over at least a majority of spacing S, advantageously at least 75% of spacing S, and more advantageously at least 90% of spacing S. As shown in FIG. 1A, the multiplication region 170 extends across the entire spacing S. As such, the field is more than sufficient to saturate carrier drift velocity across the entire spacing S ensuring that any carrier generated within the spacing S reaches saturation velocity. The critical field strength is a function of the composition of the semiconductor device layer 115 with values for bulk semiconductors available in the literature (e.g., ~120 keV/cm for Ge). For certain embodiments where the field exceeds the critical field strength for impact ionization over at least a majority of the spacing S, noise due to the multiplication process in a semiconductor material having a high k in the bulk state is reduced by thinning the multiplication region in the longitudinal dimension (e.g., x-dimension in FIG. 1A) to a distance that is only slightly greater than the dead space (e.g., no more than one order a magnitude larger than the dead space) associated with the semiconductor material and field strength. As used herein, the dead space is a minimum distance that a newly generated carrier travels within an electric field before it acquires sufficient energy to cause impact ionization.

Excess noise associated with the multiplication process is often expressed as:

$$ENF = k_{\textit{eff}} M + \left(2 - \frac{1}{M}\right)(1 - k_{\textit{eff}}).$$

Where the material has a high $k_{\textit{eff}}$, the ratio of hole impact ionization rate to that of electrons is disadvantageously symmetric, leading to higher excess noise for a given gain. Although not bound by theory, it is currently thought that the ionization path length probability distribution is advantageously reduced as the multiplication region becomes smaller, which effectively provides more control over the multiplication process causing $k_{\textit{eff}}$ to become smaller, and also has the effect of moderating the gain level. The width of multiplication region 170 may be reduced toward the size of the dead space until the level of excess noise is tolerable and gain remains (e.g., over 1) at the operating bias. As such, while a high uniform electric field is across width W that exceeds the critical field strength across a majority (e.g., 90-100%) of electrode spacing S, the spacing is small enough to render the multiplication region sufficiently thin in the longitudinal dimension that the resulting gain is not greater than 10. Under these conditions, the advantages of a highly uniform field are achieved along with the advantages of signal gain and reduced $k_{eff}$ to collectively improve the gain-bandwidth product. For one exemplary embodiment where device layer 115 is Ge, electrode spacing S is significantly smaller than 100 nm, may range from 20-80 nm, is advantageously 30-60 nm, and more advantageously 40-50 nm. For the exemplary Ge embodiment, the corresponding operating bias to achieve the field strengths described elsewhere herein is no more than 2.5 V and may be in the 1-2V range for particular exemplary electrode spacing ranges.

With structure 101 benefiting from a smaller electrode spacing and to operate under high field conditions, further embodiments may employ a passivation material to limit dark current. Dark current flows even in an absence of photogeneration of charge carriers and therefore can disadvantageously reduce photodetector sensitivity. Control of such dark current is therefore beneficial regardless of the electrode spacing S, or the uniformity of the electric field within the spacing S, although mitigation of dark current may be all the more important for embodiments with smaller electrode spacing S and high fields uniform over significant portions of device layer 115. As shown in FIG. 1B, dielectric material layer 112 is disposed between device layer 115 and substrate layer 110. Dielectric layer 112 reduces leakage current between device layer 115 and substrate layer 110 and may be any conventional dielectric material, such as, but not limited to silicon dioxide, silicon oxynitride, silicon nitride, and $Al_2O_3$. While the z-thickness of dielectric layer 112 may vary considerably as a function of optical waveguide design, in one example it is about 0.1 μm. Dielectric material layer 112 is disposed at the periphery, or outside of, an area of substrate 105 occupied by the MSM electrodes, while passivation material 121 is generally disposed within the area of substrate 105 occupied by the MSM electrodes, and is more particularly disposed between electrode pairs 131, 132. The passivation material 121 is in contact with surface 115A, and also disposed between device layer 115 and substrate layer 110, in contact with surface 115B.

Generally, passivation material 121 replaces dielectric layer 112 in at least the regions where high fields are present within device layer 115. As is described in greater detail below, the manner in which device layer 115 is formed over dielectric layer 112 may cause the interface between device layer 115 and dielectric 112 to be of poor quality, resulting in increased dark current. For example, in one embodiment where device layer 115 is formed by rapid melt growth (RMG), surface states along the interface of the crystallized semiconductor surface can have very high defect densities, trap sites, and mid-gap energy states, which can contribute significantly to dark current. A post-RMG removal of dielectric 112 and formation of passivation layer 121 has been found to advantageously reduce dark current. As such, certain embodiments herein employ a dielectric material layer disposed between the device layer and the substrate layer within a first substrate area occupied by a peripheral portion of the device layer, and a passivation material disposed between the device layer and the substrate layer within a second substrate area occupied by a central portion of the device layer where significant electric fields are present.

Figure 1C:
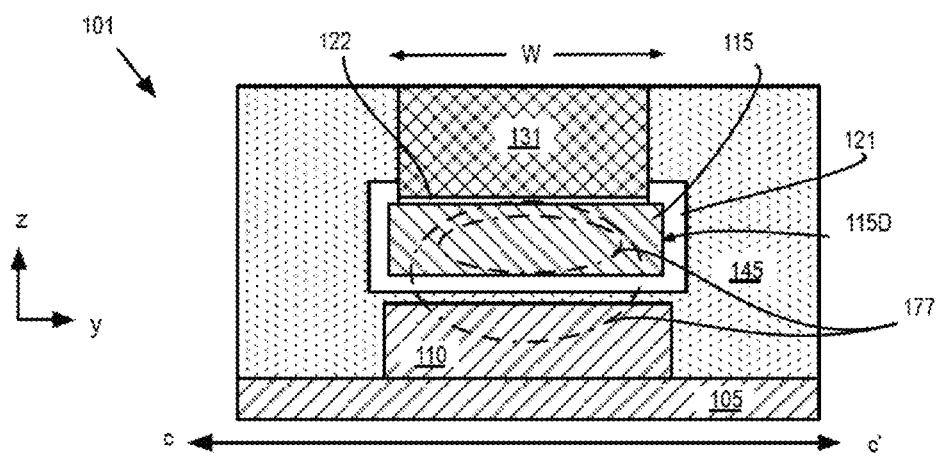
FIG. 1C is a cross-sectional view of the MSM photodetector along the c-c' line depicted in FIG. 1A, in accordance with an embodiment.

In certain advantageous embodiments, passivation material 121 wraps completely around device layer 115 within an active, or high field region of the structure (e.g., along the longitudinal length where electrode pairs 131, 132 are present). As shown in FIG. 1C, passivation material 121 is further in contact with sidewall surfaces 115D to completely encase all surfaces of device layer 115 not occupied by electrodes or other dielectric materials (e.g., dielectric 112). The thickness of passivation material 121 may vary. In advantageous embodiments, passivation material 121, or a dielectric film stack including passivation material 121 and ILD 145, is of sufficient thickness to completely fill the any void formed between device layer 115 and substrate layer 110 to ensure good mode coupling between the two.

In exemplary embodiments, passivation material 121 is of a different composition than dielectric layer 112. However, as an improvement in dark current may be had from the removal and reformation of the dielectric, embodiments where passivation material 121 is of the same composition as dielectric material 112 are also possible. Even where the composition of passivation material 121 is the same as that of dielectric layer 112, a structural distinction between the two may be nonetheless apparent. For example, passivation material 121 may be a multi-layered dielectric stack while dielectric layer 112 is not, or visa versa. In other embodiments, passivation material 121 may have a different z-thickness than dielectric layer 112. In other embodiments, passivation material 121 may be evident through an interface (e.g., at an atomic level visible in a SEM/STM image) with dielectric material 112 or with device layer 115, or through other indications of inhomogeneity (e.g., distinct stress levels evident by film etch rates, etc.). The composition of passivation material 121 may vary widely as many options exist, ranging from conventional silicon-based dielectrics (e.g., $SiO_2$, $Si_3N_4$, $SiO_xN_y$) and an inorganic polymer dielectrics (e.g., HSQ, MSQ), organic polymeric dielectrics (e.g., benzocyclobutene), non-native metal oxides (e.g., $HfO_2$, $ZrO_2$, $TiO_2$, $Al_2O_3$, and mixtures thereof), and wide bandgap semiconductor materials (e.g., SiC, SiGe, SiGeC). In particular embodiments where device layer 115 is Ge however, passivation material 121 advantageously comprises a Ge-based compound in direct contact with surfaces of device layer 115.

Exemplary forms of a Ge-based passivation material include a germanium oxide, such as GeO and $GeO_2$. Noting such oxides can be unstable and therefore challenging to manufacture, a Ge-based passivation material may instead, or in addition, comprise a nitride, for example in the form of $Ge_3N_4$, or $GeO_xN_y$. In another embodiment, the Ge-based passivation material is a chalcogen, which advantageously may be GeS, or $GeS_2$ in contact with device layer 115. Of these options, particularly advantageous results may be had with $GeO_xN_y$. In further embodiments, for a Ge-based passivation material, and more generally for any passivation material composition, a multi-layered or hybrid material may be present. For example, in a hybrid Ge-based passivation material, a Ge-based material interfaces with device layer and a second non-Ge-based material interfaces (e.g., Si-based dielectric) with the Ge-based material on a side opposite the device layer. Such a hybrid passivation layer structure may serve to improve stability of the base interface material (e.g., Ge-based dielectric) during subsequent processing and may further serve to backfill the z-thickness of the region formally occupied by dielectric 112. Optionally, a single or multi-layered passivation may be further built-up with a backend dielectric. This is illustrated in FIG. 1B where ILD 145, which may be any conventional or low-k dielectric (e.g., carbon doped silicon dioxide), is disposed between passivation 121 and substrate layer 110 to completely fill a region that was formally occupied by dielectric 112.

In further embodiments, a second passivation material is disposed between the device layer and an electrode. For example, as further shown in FIG. 1C, a second passivation material 122 is disposed between device layer 115 and electrode 131. Second passivation material 122 may further reduce dark current associated with the Schottky junction formed between metal of electrode 131 and semiconductor of device layer 115. Second passivation material 122 may be any of the compositions described above for passivation material 121, with Ge-based materials being advantageous, and of those, chalcogens being potentially particularly useful in this capacity. In the exemplary embodiment, second passivation material 122 has the same composition as passivation material 121. The z-thickness of second passivation material 122 may deviate from that of passivation material 121 even where of a same composition for the sake of maintaining a low contact resistance. For example, second passivation material 122 may be thinner than passivation material 121, with an exemplary thickness being less than 5 nm, and advantageously less than 2 nm.

Figure 2A:
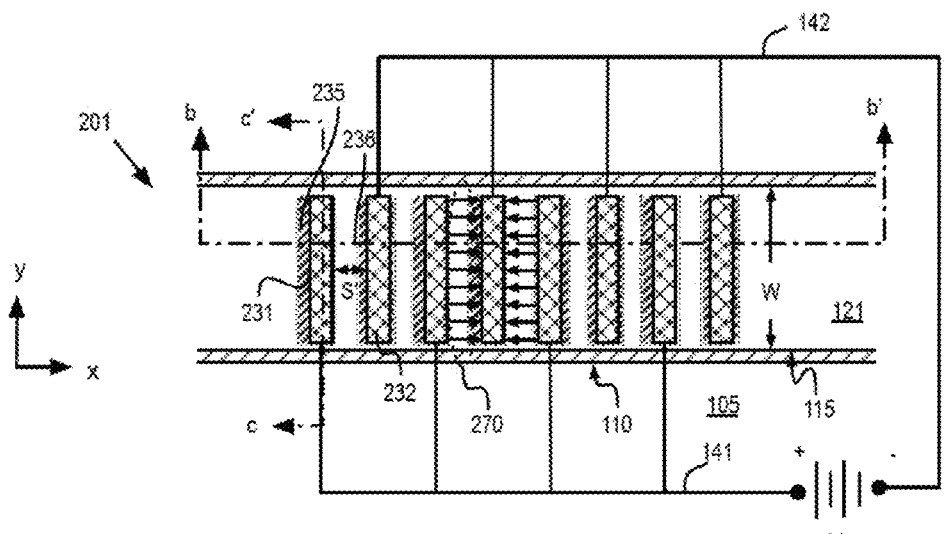
FIG. 2A is a plan view of a waveguide-coupled p-i-n photodetector, in accordance with an embodiment.
Figure 2B:
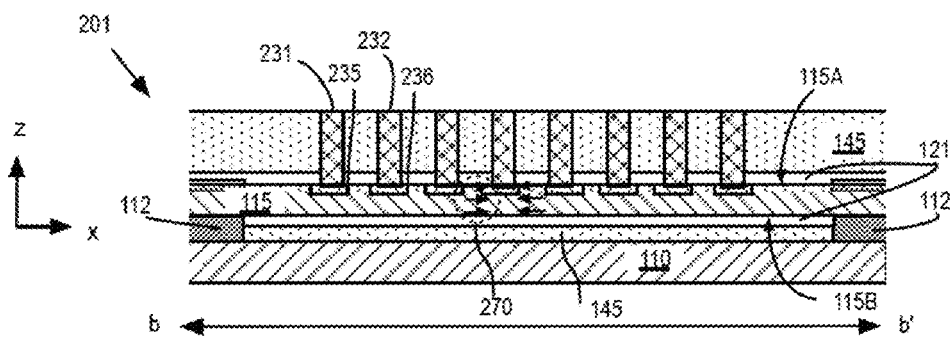
FIG. 2B is a cross-sectional view of the p-i-n photodetector along the b-b' line depicted in FIG. 2A, in accordance with an embodiment.
Figure 2C:
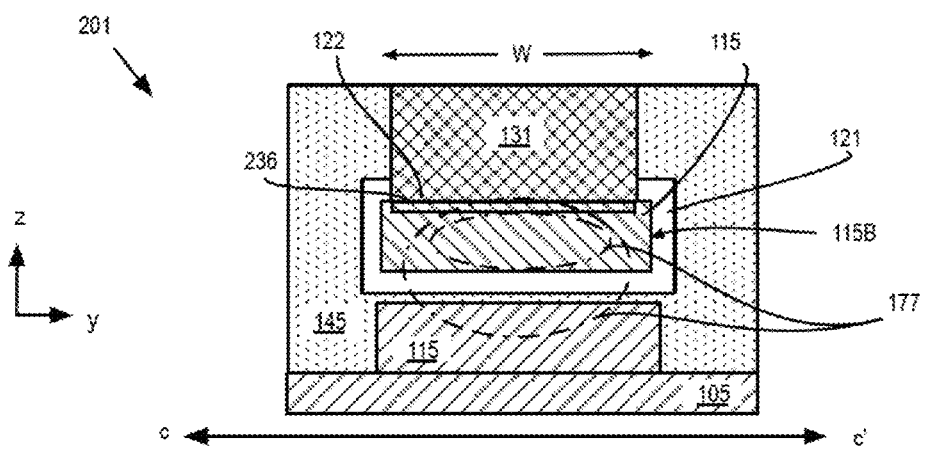
FIG. 2C is a cross-sectional view of the p-i-n photodetector along the c-c' line depicted in FIG. 2A, in accordance with an embodiment.

In another exemplary embodiment, a low voltage photodetector has a p-i-n photodiode architecture including p-type and n-type impurity doped regions, as is depicted in FIGS. 2A-2C. As shown in FIGS. 2A and 2B, complementary impurity doped regions 235 and 236 are disposed across the longitudinal length the patterned device layer 115. Photodiode structure 201 is adapted for edge illumination with the device layer 115 being any of those previously described in the context of photodiode structure 101 (e.g., Ge). The patterning of device layer 115 and substrate layer 110 is also as previously described. For p-i-n embodiments however, pairs of metal electrodes 231, 232 form a series of contacts to provide a (reverse) bias between adjacent complementary impurity doped regions (p-type) 235 and (n-type) 236. Metal electrode 231 is again one of a plurality of first electrodes electrically coupled to a plurality of first impurity regions 235, with all of these first impurity regions 235 coupled together by routing metal 141, to sustain a first electrical potential. Likewise, electrode 232 is one of a plurality of second electrodes electrically coupled to a plurality of second impurity regions 236 interdigitated with the plurality of first impurity regions 235 to have a spacing S' between adjacent impurity regions that is substantially constant across all electrodes in the exemplary embodiment. The metals employed may therefore be of differing work functions and need not extend over a majority of transverse width W. In embodiments, the impurity doped regions extend over at least the same width W described for electrode pairs in the context of photodiode structure 101 to similarly provide for a highly uniform field across at least a majority of width W.

Semiconductor within spacing S' between adjacent complementary doped regions is relatively more lightly doped (e.g., intrinsic impurity levels) and may also share in common one or more of the other functional characteristics of the electrode spacing S described above in the context of photodiode structure 101. For example, in p-i-n photodiode structure 201, spacing S' is sufficiently small to ensure field strength exceeds the impact ionization critical field across at least a majority of spacing S', advantageously at 75% of spacing S', and more advantageously at least 900 of spacing S' at the operating voltage (e.g., less than 2.5 V and advantageously less than 2.0V). For such embodiments, the multiplication region 270 may be narrowed in the longitudinal (y) dimension toward the size the dead space until excess noise level is tolerable and gain remains (e.g., over 1) at the operating bias for optimal gain-bandwidth product. As such, while a high uniform electric field is provided across width W that exceeds the critical field strength across 90%, or more (e.g., 100%) of spacing S', this spacing is small enough to render the multiplication region 270 sufficiently thin that the resulting gain is no greater than 10.

As further illustrated in FIG. 2B, electric field strength across the z-thickness of device layer 115 may be more uniform than found in MSM photodiode structure 101. Device layer 115 may therefore be relatively thicker than for MSM embodiments (e.g., up to, and even exceeding 1 μm), potentially offering higher responsivity. The impurity doped regions 235, 236 generally do not extend through the device layer z-thickness and instead are limited to a surface depth less that is advantageously less than half of the device layer z-thickness, and more advantageously less than 25% of the device layer z-thickness to minimize impurity related losses.

Figure 3:
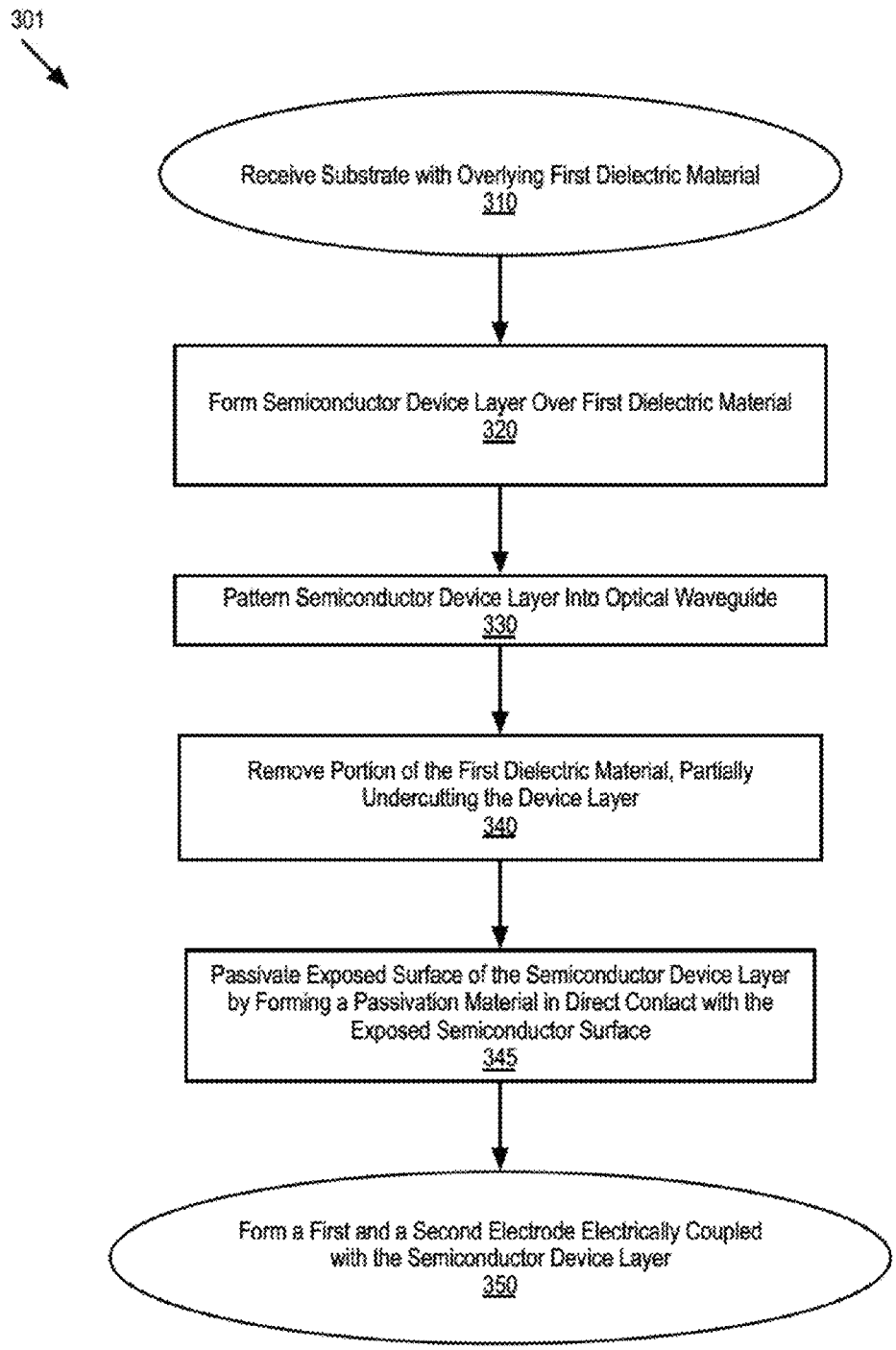
FIGS. 3 and 4 are flow diagrams illustrating methods of fabricating an MSM or p-i-n photodetector, in accordance with an embodiment.
Figure 4:
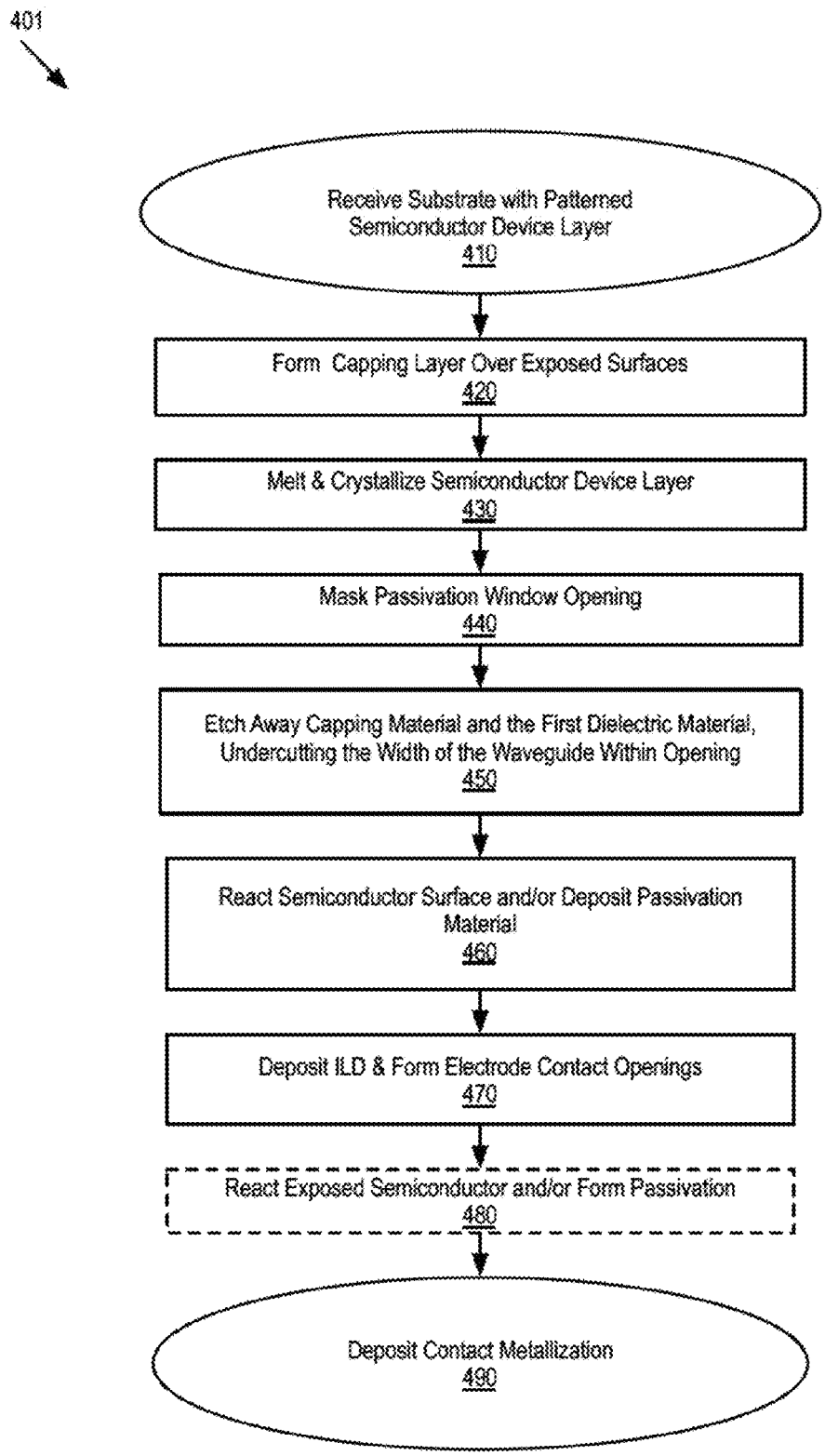

Proceeding with description of fabrication features relating to the two exemplary low voltage photodetector structures 101 and 201, FIGS. 3 and 4 are flow diagrams illustrating methods of fabricating an MSM or p-i-n photodetector, in accordance with an embodiment. FIGS. 5A, 5B, 5C, 5D, 5E, 5F, and 5G are cross-sectional views along the b-b' line shown in FIG. 1A following certain operations as an MSM detector is fabricated, in accordance with an embodiment. Reference labels in FIGS. 5A-5G are retained from FIGS. 1A-1C where the attributes of the referenced object remain the same.

Figure 5A:
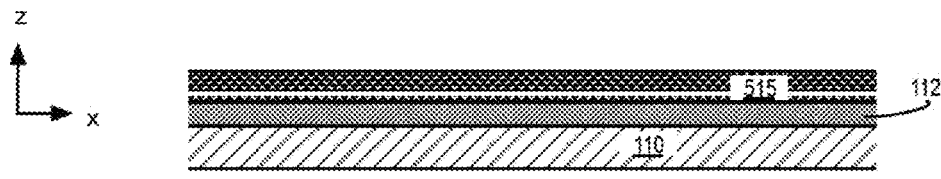
FIGS. 5A, 5B, 5C, 5D, 5E, 5F, and 5G are cross-sectional views along the b-b' line shown in FIG. 1A following certain operations as an MSM detector is fabricated, in accordance with an embodiment.

Referring first to FIG. 3, method 301 begins at operation 310 with receipt of a substrate having an overlying first dielectric material layer. A semiconductor device layer is then formed over this dielectric layer at operation 320. FIG. 5A, illustrates one exemplary embodiment where semiconductor layer 515 is deposited onto dielectric layer 112 by chemical vapor deposition (CVD), and/or another conventional depositioi technique suitable for the particular semiconductor (e.g., Ge). In one embodiment, semiconductor layer 515, as-deposited, is in a granular or substantially amorphous state. Alternatively, a transferred layer process may be employed to bond the semiconductor device layer to the dielectric layer 112. For such embodiments the semiconductor device layer may be substantially monocrystalline as-bonded.

Method 301 then proceeds to operation 330 where the semiconductor layer is patterned, for example in to an optical waveguide having a desired transverse width, etc., using lithographic and semiconductor etch processes conventional in the art for the particular material compositions. Referring to FIG. 5A, during operation 330, dielectric layer 112 and substrate layer 110 may be similarly patterned to provide desired optical coupling/guiding of electromagnetic modes to be propagated. At operation 340, a portion of the first dielectric material is removed to undercut the device layer. Exposed semiconductor surfaces are then passivated at operation 345 and at least a first and second electrode then electrically coupled to the device layer at operation 350.

Figure 5B:
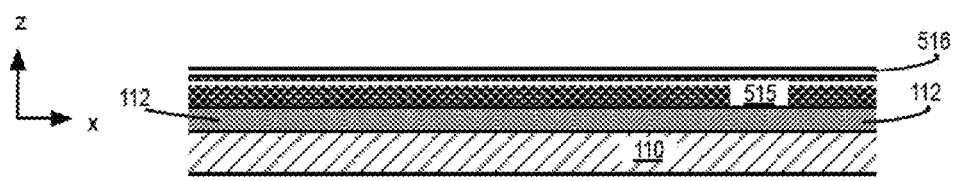
Figure 5C:
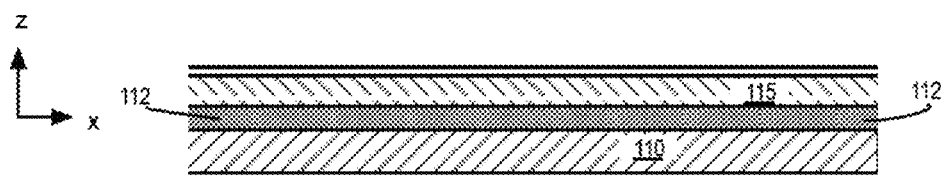

Prior to operation 340, embodiments with a highly granular and/or amorphous semiconductor device layer (e.g., semiconductor layer 515 in FIG. 5A) are further processed through an RMG process, exemplified in FIG. 4 and FIGS. 5B and 5C. Referring to FIG. 4, method 401 begins at operation 410 with receipt of a substrate with a patterned semiconductor device layer, for example, from operation 330 (FIG. 3). At operation 420 a capping layer is formed over exposed surfaces of the device layer. As shown in FIG. 5B for example, capping layer 516 is deposited over all exposed waveguide surfaces of device layer 515. Returning to FIG. 4, the semiconductor device layer is melted and re-crystallized at operation 430. In general, such a melt is performed rapidly, for example on the order of a second, and any conventional rapid thermal process may be employed. Following melt, recrystallization proceeds from a seeding surface of substrate layer 110 and extends through the patterned semiconductor layer 515, resulting in a significant long range order improvement and advantageously converting patterned semiconductor layer 515 into a crystalline patterned device layer 115, as shown in FIG. 5C.

Figure 5D:
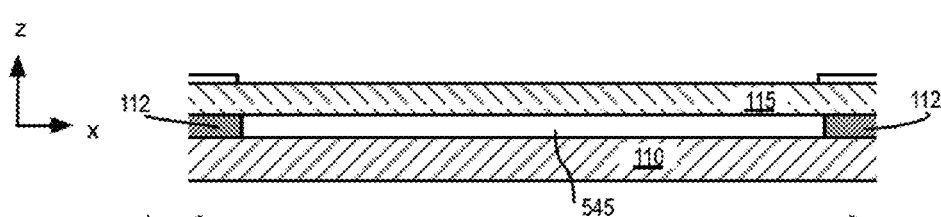

Proceeding with FIG. 4, following RMG operation 430, a passivation opening mask is formed at operation 440. Using any conventional lithography, a window is patterned to define where dielectric on device layer 115 is to be removed to expose semiconductor surfaces. Beginning with operation 440, method 401 is also applicable to embodiments not employing RMB. For example, in an embodiment where a transferred layer process was employed, dark current may be advantageously reduced through replacement of the dielectric that participate in a compression/thermal bond within at least the high field region of photodiode structures. At operation 450, capping materials (if present) and the dielectric material disposed between the device layer and substrate layer are etched away, advantageously undercutting the entire width of the waveguide within the window opening formed at operation 440. Regions of dielectric layer 112 retained outside of the window may anchor the undercut device layer. For example, as shown in FIG. 5D, void 545 is formed during operation 450 and all surfaces of device layer 115 are exposed within this central region. In certain embodiments, an etch (e.g., wet chemical) of the device layer may be performed at operation 450 as well, for example to remove 3-10 nm of semiconductor surface.

Figure 5E:
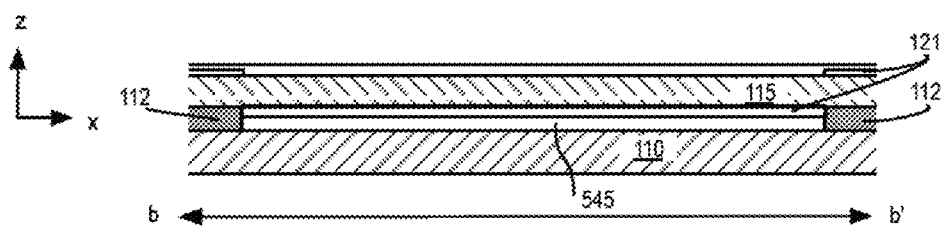

Method 401 then proceeds to operation 460 where the exposed surface of the device layer is reacted (e.g., oxidized, nitridized, etc.) to form a passivation layer, and/or a passivation layer is deposited over exposed surfaces of the device layer. Reactions of the semiconductor surface, and/or depositions onto the surface, are advantageously highly conformal, employing techniques such as, but not limited to, thermal oxidation, CVD, or atomic layer deposition (ALD) to ensure coverage within undercut regions. Certain wet chemical agents may also be utilized, for example to form sulphur ligands on the device layer. FIG. 5E depicts an example of a structure following operation 460 where void 545 remains following the formation of passivation material 121, which is a function of the passivation material thickness.

Figure 5F:
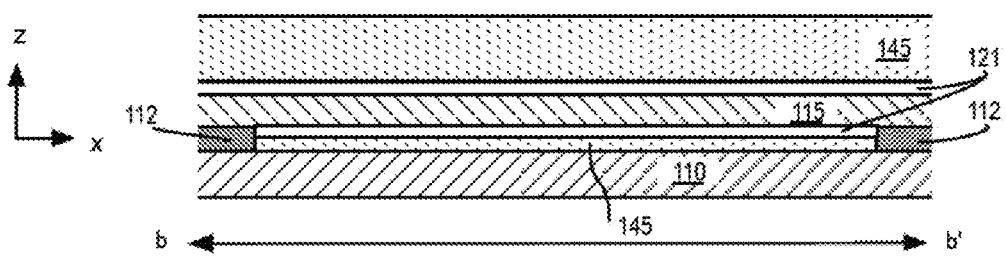
Figure 5G:
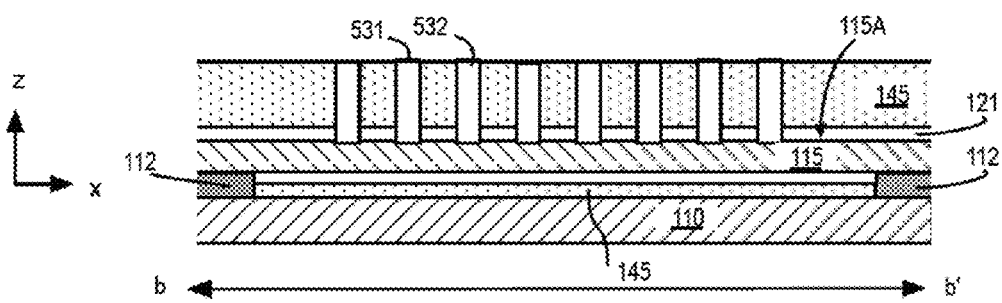

Proceeding with FIG. 4, at operation 470 an interlayer dielectric (ILD) is subsequently deposited, using any conventional technique, to form any convention material, such as, but not limited to, a low-k dielectric (e.g., carbon-doped silicon dioxide, etc.). As shown in FIG. 5F, void 545 may then be filled by ILD 145 to ensure good optical coupling between device layer 115 and substrate 110. Also at operation 470, electrode contact openings are formed into the ILD using any conventional lithography and etch techniques known in the art to be suitable for the particular ILD. The contact openings are advantageously defined with a spacing that is not necessarily minimum of the lithography process capability, as is often done for the sake of greater device density. Instead, the contact spacing is to set the desired electrode spacing to ensure proper field strength and thickness of the multiplication region. To this end, a lithography process capable of a minimum pitch may be biased to achieve a desired spacing at whatever nominal electrode dimension then results from the pitch capability. These openings are then filled at operation 490 with the MSM photodiode structure 101 in completion of method 401. As a further option in method 401, operation 480 may be performed prior to the contact metal deposition operation 490. At operation 480, semiconductor exposed within contact openings 531, 532 may be reacted, and/or a deposition performed, to form a thin (e.g., 3-10 nm) second passivation material (e.g. a GeS or $GeS_2$, etc.) having a same or different composition as passivation material 121 to achieve desired Schottky characteristics with the contact metallization.

Noting the similarities between photodiode structures 101 (FIG. 1A) and 201 (FIG. 2A), the operations in methods 301, 401 illustrated and described in the context of the MSM photodiode structure 101 are generally equally applicable to the p-i-n photodiode structure 201 with the additional need to form impurity doped regions. For RMG embodiments, such doped regions may be generally formed before or after the RMG process using any doping techniques conventional in the art with dopant masking defining critical spacing S'.

Figure 6:
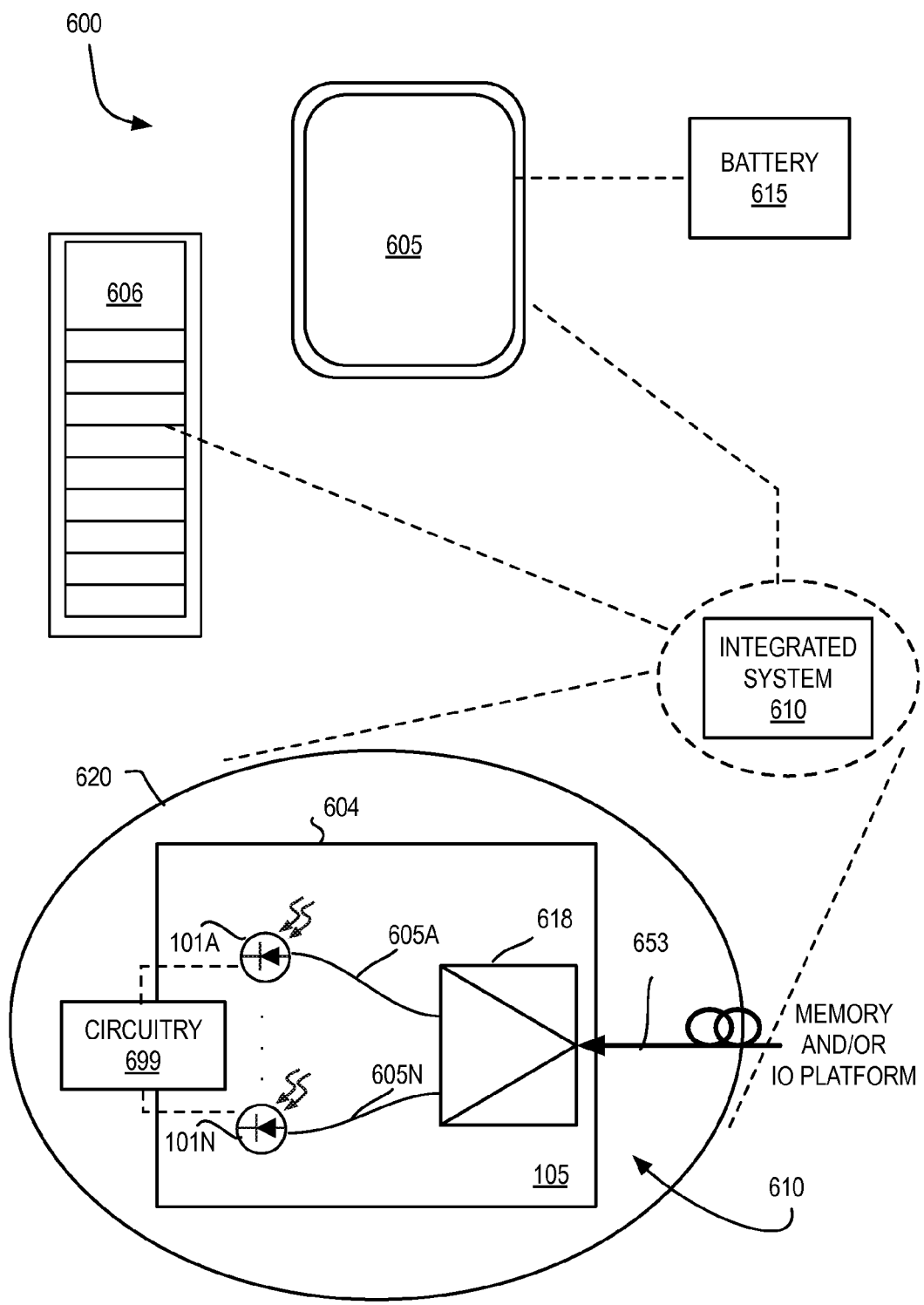
FIG. 6 illustrates a mobile computing platform and a data server machine employing an optical receiver module including a PIC with a waveguide-coupled low voltage photodetector, in accordance with embodiments of the present invention.

FIG. 6 illustrates a system 600 in which a mobile computing platform 605 and/or a data server machine 606 employs a low voltage photodiode, in accordance with embodiments of the present invention. Server machine 606 may be any commercial server, for example including any number of high performance computing platforms disposed within a rack and networked together for electronic data processing, which in the exemplary embodiment includes integrated system 610. Mobile computing platform 605 may be any portable device configured for each of electronic data display, electronic data processing, wireless electronic data transmission, or the like. For example, mobile computing platform 605 may be any of a tablet, a smart phone, laptop computer, etc., and may include a display screen (e.g., a capacitive, inductive, resistive, touchscreen), a chip-level or package-level integrated system 610, and a battery 615.

Whether disposed within integrated system 610, further illustrated in expanded view 620, or as a stand-alone packaged chip, packaged monolithic PIC 604 includes a waveguide-coupled low voltage photodiode, in accordance with embodiments of the present invention. Optical wire 653 inputs a single optical beam, for example by top-side coupling or edge coupling. Selected wavelengths are then separated with optical demultiplexer 618 to output to a plurality of optical waveguides 605A-605N disposed on substrate 105. Optical waveguides 605A-605N are each further coupled into a low voltage photodetectors 101A-101N, each of which includes an MSM or p-i-n photodiode structure in accordance with one or more embodiments described elsewhere herein. The photodetectors 101A-101N are in turn electrically coupled to downstream integrated circuitry 699, which may for example further include a voltage supply and sense circuitry. In certain embodiments, voltage supply and sense circuitry is implemented with CMOS transistors also disposed on the substrate 105 and powered at a voltage level no less than that at which the photodetectors are operated. In embodiments where the photodetectors 101A-101N employ Ge APD architectures described herein, both the photodetectors 101A-101N and the circuitry 699 are powered at a same operating voltage (e.g., no more than 3.3V). In embodiments, the photodetectors 101A-101N each include one or more of the features described for one or more embodiments of photodiode structure 101 and 201.

Figure 7:
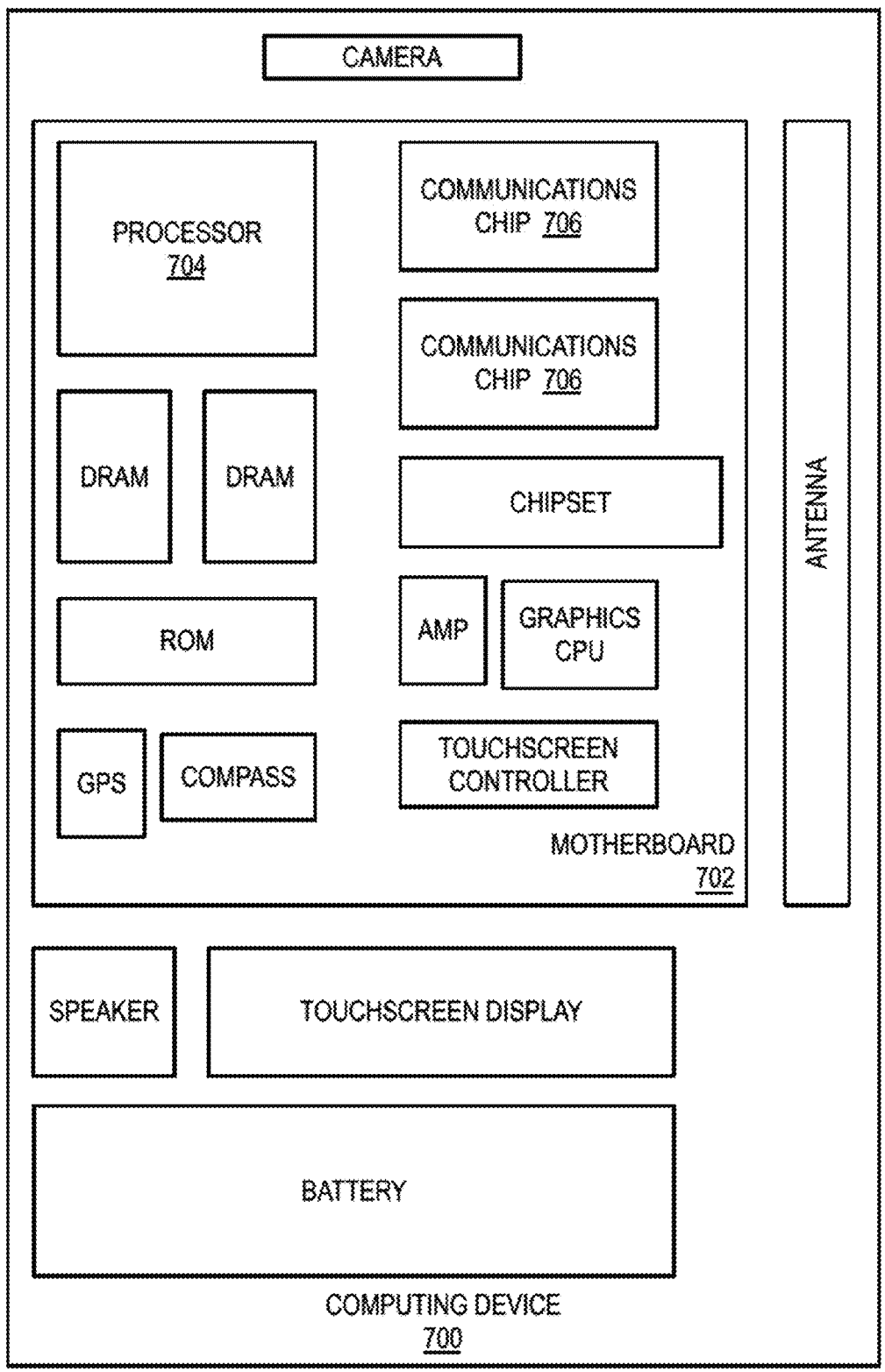
FIG. 7 is a functional block diagram of an electronic computing device, in accordance with an embodiment of the present invention.

FIG. 7 is a functional block diagram of a computing device 700, arranged in accordance with at least some implementations of the present disclosure. Computing device 700 may be found inside platform 605 or server machine 606, for example, and further includes a motherboard 702 hosting a number of components, such as but not limited to a processor 704 (e.g., an applications processor), which may incorporate local inter-level interconnects as discussed herein, and at least one communication chip 706. In embodiments, at least one of the processor 704 one or more communication chips 706, or the like. Processor 704 may be physically and/or electrically coupled to motherboard 702. In some examples, processor 704 includes an integrated circuit die packaged within the processor 704. In general, the term "processor" or "microprocessor" may refer to any device or portion of a device that processes electronic data from registers and/or memory to transform that electronic data into other electronic data that may be stored in registers and/or memory.

In various examples, one or more communication chips 706 may also be physically and/or electrically coupled to the motherboard 702. In further implementations, communication chips 706 may be part of processor 704. Depending on its applications, computing device 700 may include other components that may or may not be physically and electrically coupled to motherboard 702. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth), or the like.

Communication chips 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 706 may implement any of a number of wireless standards or protocols, including but not limited to those described elsewhere herein. As discussed, computing device 700 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to particular exemplary embodiments.

One exemplary photodetector, includes a semiconductor device layer having a longitudinal length and a transverse width extending laterally over an area of a semiconductor substrate layer, at least a first and second electrode electrically coupled to the device layer and separated by a spacing, a dielectric material layer disposed between the device layer and the substrate layer in a region outside of the spacing, and a passivation material disposed between the device layer and the substrate layer in a region within the spacing.

As a further example, the first electrode is one of a plurality of first electrodes electrically coupled to the device layer within the second substrate area, all first electrodes coupled together to sustain a first electrical potential. The second electrode is one of a plurality of second electrodes electrically coupled to the device layer within the second substrate area and interdigitated with the first electrodes to have a spacing between adjacent electrodes, and all second electrodes are coupled together to sustain a second electrical potential different from the first electrical potential by the operating bias. The passivation material is further disposed on a surface of the device layer within each space between the first and second electrodes.

As a further example, the first electrode is one of a plurality of first electrodes electrically coupled to the device layer within the second substrate area, all first electrodes coupled together to sustain a first electrical potential. The second electrode is one of a plurality of second electrodes electrically coupled to the device layer within the second substrate area and interdigitated with the first electrodes to have a spacing between adjacent electrodes, and all second electrodes are coupled together to sustain a second electrical potential different from the first electrical potential by the operating bias. The passivation material is disposed on a surface of the device layer within each space between the first and second electrodes, and a second passivation material is disposed between the device layer and each of the first and second electrodes.

As a further example, the device layer comprises monocrystalline or polycrystalline Ge; and the passivation material comprises a germanium oxide, germanium nitride, germanium oxynitride, or germanium chalcogen in direct contact with surfaces of the Ge device layer.

As a further example, the device layer comprises monocrystalline or polycrystalline Ge, and the passivation layer comprises an organic polymeric dielectric, a silicon-based polymeric dielectric, or a doped silicon dioxide completely filling a region between the device layer and substrate layer.

As a further example, the device layer is monocrystalline or polycrystalline Ge or a III-V semiconductor alloy patterned into a first optical waveguide having a longitudinal length and transverse width extending laterally over the second substrate area. The substrate layer comprises Si and is patterned into a second optical waveguide disposed under the first optical waveguide and also having a longitudinal length extending laterally over the second substrate area to evanescently couple light with the first optical waveguide. The passivation layer is disposed between first and second optical waveguides, and wraps around the longitudinal length of the first optical waveguide to further contact a sidewall of the device layer and a surface of the device layer extending between the first and second electrodes.

As a further example, the first and second electrodes each comprise a same metal forming series metal-semiconductor-metal Schottky diodes with a surface of the device layer. The space between the first and second electrode is sufficiently small that a multiplication region within the device layer between the first and second electrodes provides an avalanche gain of less than 10 when an operating bias applied across the first and second electrode is less than 2.0 V.

As a further example, the first and second electrodes each comprise a same metal forming series metal-semiconductor-metal Schottky diodes with a surface of the device layer. The spacing between the first and second electrode is sufficient to provide an electric field high enough over the entire spacing to induce impact ionization when an operating bias applied across the first and second electrode is less than 2.0 V, and a multiplication region present within the spacing is sufficiently thin that gain is between 1 and 10 at the operating bias.

As a further example, the first electrode is electrically coupled to a p-type impurity doped region of the device layer. The second electrode is electrically coupled to an n-type impurity doped region of the device layer, and a region of the device layer within the spacing is more lightly impurity doped than the p-type and n-type doped regions.

As a further example, the first electrode is electrically coupled to a p-type impurity doped region of the device layer. The second electrode is electrically coupled to an n-type impurity doped region of the device layer. A region of the device layer within the spacing is more lightly impurity doped than the p-type and n-type doped regions. The dimension of the more lightly impurity doped region is sufficient to provide an electric field high enough over the entire lightly impurity doped region to induce impact ionization when an operating bias applied across the first and second electrode is less than 2.0 V, and a multiplication region present within the spacing is sufficiently thin that gain is between 1 and 10.

One exemplary PIC includes a photodetector and a voltage supply circuitry coupled to the first and second electrode to provide the operating voltage. The photodetector further includes a patterned semiconductor device layer disposed over an area of a semiconductor substrate layer, at least a first and second electrode electrically coupled to the device layer, a dielectric material layer disposed between the device layer and the substrate layer within a first substrate area occupied by the device layer, and a passivation material disposed between the device layer and the substrate layer within a second substrate area occupied by the device layer. A sensing circuitry is coupled to the first electrode to sense a current between the first and second electrodes.

As a further example, sensing circuitry further includes CMOS transistors disposed over a second area of the semiconductor substrate layer, the CMOS transistors also powered by the voltage supply circuitry.

One exemplary electronic device includes a processor, a memory, and an optical receiver module chip communicatively coupled to at least one of the processor and the memory. The optical receiver module further includes a PIC including an optical waveguide disposed over a semiconductor substrate, the waveguide optically coupled to a photodetector further including a patterned semiconductor device layer disposed over an area of a semiconductor substrate layer, at least a first and second electrode electrically coupled to the device layer, a dielectric material layer disposed between the device layer and the substrate layer within a first substrate area occupied by the device layer, and a passivation material disposed between the device layer and the substrate layer within a second substrate area occupied by the device layer.

An exemplary method of forming a photodetector includes forming a semiconductor device layer over a dielectric material layer disposed over a semiconductor substrate layer, patterning the device layer into a feature having a longitudinal length significantly longer than a transverse width, removing a portion of the dielectric material layer, to fully undercut the transverse width along the longitudinal length and expose a surface of the device layer, forming a passivation material in direct contact with the exposed surface of the device layer, and forming a first and a second electrode electrically coupled with the device layer, the first and the second electrodes having a space there between.

As a further example, forming the semiconductor device layer further includes depositing a semiconductor material on the dielectric material layer, and melting and crystallizing the semiconductor material. Forming a passivation material further includes forming the passivation material on all exposed surfaces of the feature between the first and second electrodes after melting and crystallizing the semiconductor material.

As a further example, forming the semiconductor device layer further includes forming monocrystalline or polycrystalline Ge, and forming the passivation material further includes forming a germanium oxide, germanium nitride, germanium oxynitride, or germanium chalcogen in direct contact with surfaces of the Ge device layer.

As a further example, forming the semiconductor device layer further includes forming monocrystalline or polycrystalline Ge, and forming the passivation material further includes forming an organic polymeric dielectric, a silicon-based polymeric dielectric, or a doped silicon dioxide completely filling a region between the device layer and substrate layer.

As a further example, forming the passivation material further includes completely replacing the portion of the dielectric material layer to fully backfill the transverse width along the longitudinal length.

As a further example, metallization for the first and second electrode is deposited onto a second passivation material disposed into a contact opening formed in an ILD covering the device layer.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A photodetector, comprising:
   a semiconductor device layer having a longitudinal length and a transverse width extending laterally over an optical waveguide comprising a semiconductor substrate layer;
   at least a first and second electrode electrically coupled to the device layer and separated by a lateral spacing;
   a dielectric material layer disposed between the device layer and the substrate layer in a region outside of the lateral spacing; and
   a passivation material disposed between the device layer and the substrate layer in a region within the lateral spacing.

2. The photodetector of claim 1, wherein:
   the first electrode is one of a plurality of first electrodes electrically coupled to the device layer;
   all the first electrodes are coupled together to sustain a first electrical potential;
   the second electrode is one of a plurality of second electrodes electrically coupled to the device layer and interdigitated with the first electrodes to have the lateral spacing between adjacent electrodes;
   all the second electrodes are coupled together to sustain a second electrical potential different from the first electrical potential by an operating bias; and
   the passivation material is further disposed on a surface of the device layer within each lateral spacing between the first and second electrodes.

3. The photodetector of claim 1, wherein:
   the first electrode is one of a plurality of first electrodes electrically coupled to the device layer;
   all the first electrodes are coupled together to sustain a first electrical potential;
   the second electrode is one of a plurality of second electrodes electrically coupled to the device layer and interdigitated with the first electrodes to have a spacing between adjacent electrodes;

all the second electrodes are coupled together to sustain a second electrical potential different from the first electrical potential by an operating bias;

the passivation material is disposed on a surface of the device layer within each spacing between the first and second electrodes; and a second passivation material is disposed between the device layer and each of the first and second electrodes.

4. The photodetector of claim 1, wherein:
the device layer comprises monocrystalline Ge; and
the passivation material comprises a germanium oxide, germanium nitride, germanium oxynitride, or germanium chalcogen in direct contact with surfaces of the Ge device layer.

5. The photodetector of claim 1, wherein:
the device layer comprises monocrystalline Ge or a III-V alloy; and
the passivation material comprises an organic polymeric dielectric, a silicon-based polymeric dielectric, or a doped silicon dioxide completely filling a region between the device layer and substrate layer.

6. The photodetector of claim 1, wherein:
the device layer is monocrystalline Ge or a III-V alloy;
the substrate layer comprises Si also having at least the longitudinal length to evanescently couple light into the device layer; and
the passivation material wraps around the longitudinal length of the device layer to further contact a sidewall of the device layer and a top surface of the device layer opposite the substrate layer within the lateral spacing between the first and second electrodes.

7. The photodetector of claim 1, wherein:
the lateral spacing between the first and second electrode is sufficiently small that a multiplication region within the device layer between the first and second electrodes provides an avalanche gain of less than 10 when an operating bias applied across the first and second electrode is less than 2.0 V.

8. The photodetector of claim 1, wherein:
the device layer is monocrystalline or polycrystalline Ge or a III-V alloy;
the first and second electrodes each comprise a same metal forming a series of metal-semiconductor-metal Schottky diodes with a surface of the device layer, the lateral spacing between the first and second electrode is sufficient to provide an electric field high enough over the entire lateral spacing to induce impact ionization when an operating bias applied across the first and second electrode is less than 2.0 V; and
a multiplication region present within the lateral spacing is sufficiently thin that gain is between 1 and 10 at the operating bias.

9. The photodetector of claim 1, wherein:
the first electrode is electrically coupled to a p-type impurity doped region of the device layer; the second electrode is electrically coupled to an n-type impurity doped region of the device layer; and
a region of the device layer within the spacing is more lightly impurity doped than the p-type and n-type doped regions.

10. The photodetector of claim 1, wherein:
the first electrode is electrically coupled to a p-type impurity doped region of the device layer;
the second electrode is electrically coupled to an n-type impurity doped region of the device layer;
a region of the device layer within the spacing is more lightly impurity doped than the p-type and n-type doped regions; and
the dimension of the more lightly impurity doped region is sufficient to provide an electric field high enough over the entire lightly impurity doped region to induce impact ionization when an operating bias applied across the first and second electrode is less than 2.0 V; and
a multiplication region present within the lightly impurity doped region is sufficiently thin that gain is between 1 and 10.

11. An electronic device, comprising:
a processor;
a memory; and
an optical receiver module chip communicatively coupled to at least one of the processor and the memory, wherein the optical receiver module further comprises:
a photonic integrated circuit (PIC) disposed over a semiconductor substrate, the PIC comprising the optical waveguide and the photodetector of claim 1.

12. A photonic integrated circuit (PIC), comprising:
a photodetector, further comprising:
a semiconductor device layer disposed over an area of an optical waveguide comprising a semiconductor substrate layer, at least a first and second electrode electrically coupled to the device layer;
a dielectric material layer disposed between the device layer and the substrate layer in a first substrate area occupied by the device layer that is outside of a lateral spacing between the first and second electrode; and
a passivation material disposed between the device layer and the substrate layer in a second substrate area occupied by the device layer that is within the lateral spacing between the first and second electrode;
a voltage supply circuitry coupled to the first and second electrode to provide an operating voltage across the first and second electrode; and
a sensing circuitry coupled to at least the first electrode to sense a current between the first and second electrodes.

13. The PIC of claim 12, wherein the sensing circuitry further comprises CMOS transistors disposed over a second area of the semiconductor substrate layer, the CMOS transistors also powered by the voltage supply circuitry.

14. A method of forming a photodetector, the method comprising:
forming a semiconductor device layer over a dielectric material layer disposed over a semiconductor substrate layer, patterning the device layer into a feature having a longitudinal length significantly longer than a transverse width;
removing a portion of the dielectric material layer to fully undercut the transverse width along the longitudinal length and expose a surface of the device layer;
forming a passivation material in direct contact with the exposed, undercut surface of the device layer; and forming a first and a second electrode electrically coupled with the device layer, the first and the second electrodes having a space there between.

15. The method of claim 14, wherein forming a semiconductor device layer further comprises:
depositing a semiconductor material on the dielectric material layer, and melting and crystallizing the semiconductor material; and
wherein forming a passivation material further comprises forming the passivation material on all exposed surfaces of the feature between the first and second electrodes after melting and crystallizing the semiconductor material.

16. The method of claim 14, wherein:
forming the semiconductor device layer further comprises forming monocrystalline or polycrystalline Ge;
forming the passivation material further comprises forming a germanium oxide, germanium nitride, germanium oxynitride, or germanium chalcogen in direct contact with surfaces of the Ge device layer.

17. The method of claim 14, wherein:
forming the semiconductor device layer further comprises forming monocrystalline or polycrystalline Ge;
forming the passivation material further comprises forming an organic polymeric dielectric, a silicon-based polymeric dielectric, or a doped silicon dioxide completely filling a region between the device layer and substrate layer.

18. The method of claim 14, wherein forming the passivation material further comprises completely replacing the portion of the dielectric material layer to fully backfill the transverse width along the longitudinal length.

19. The method of claim 14, wherein the passivation material is a first passivation material and wherein the method further comprises depositing metallization for the first and second electrode onto a second passivation material disposed into a contact opening formed in an ILD covering the device layer.

20. The method of claim 19, wherein the second passivation material has the same composition as the first passivation material, but the thickness of the second passivation material within the contact opening is less than the thickness of the first passivation material outside of the contact opening.

21. A photodetector, comprising:
a semiconductor device layer having a longitudinal length and a transverse width extending laterally over a semiconductor substrate layer;
at least a first and second electrode electrically coupled to the device layer and separated by a lateral spacing;
a dielectric material layer disposed between the device layer and the substrate layer in a region outside of the lateral spacing; and
a passivation material disposed between the device layer and the substrate layer in a region of the within the lateral spacing, wherein
the lateral spacing between the first and second electrode is sufficiently small that a multiplication region within the device layer between the first and second electrodes provides an avalanche gain of less than 10 when an operating bias applied across the first and second electrode is less than 2.0 V.

22. An electronic device, comprising:
a processor;
a memory; and
an optical receiver module communicatively coupled to at least one of the processor and the memory, wherein the optical receiver module comprises a photonic integrated circuit (PIC), and the PIC further comprises an optical waveguide disposed over a semiconductor substrate, wherein the waveguide comprises a semiconductor layer and is optically coupled to a photodetector, the photodetector further comprising:
a semiconductor device layer having a longitudinal length and a transverse width extending laterally over the semiconductor layer;
at least a first and second electrode electrically coupled to the device layer and separated by a lateral spacing;
a dielectric material layer disposed between the device layer and the semiconductor layer in a region outside of the lateral spacing; and
a passivation material disposed between the device layer and the semiconductor layer in a region within the lateral spacing.

* * * * *